(12) United States Patent
Kumar et al.

(10) Patent No.: US 10,222,415 B2
(45) Date of Patent: Mar. 5, 2019

(54) GENERIC WIDTH INDEPENDENT PARALLEL CHECKER FOR A DEVICE UNDER TEST

(71) Applicant: STMicroelectronics International N.V., Amsterdam (NL)

(72) Inventors: Tejinder Kumar, Moga (IN); Suchi Prabhu Tandel, Daman (IN); Rakesh Malik, Noida (IN)

(73) Assignee: STMicroelectronics International N.V., Schiphol (NL)

( * ) Notice: Subject to any disclaimer, the term of this patent is extended or adjusted under 35 U.S.C. 154(b) by 116 days.

(21) Appl. No.: 15/375,542

(22) Filed: Dec. 12, 2016

(65) Prior Publication Data
US 2018/0164370 A1 Jun. 14, 2018

(51) Int. Cl.
*G01R 31/317* (2006.01)
*G01R 31/3193* (2006.01)

(52) U.S. Cl.
CPC ... *G01R 31/31703* (2013.01); *G01R 31/3193* (2013.01)

(58) Field of Classification Search
CPC .............. G01R 31/31703; G01R 31/3193
See application file for complete search history.

(56) References Cited

U.S. PATENT DOCUMENTS

| | | | | |
|---|---|---|---|---|
| 5,563,833 | A * | 10/1996 | Adams | G06F 12/0893 365/201 |
| 7,219,113 | B2 | 5/2007 | Bonaccio et al. | |
| 2005/0166102 | A1* | 7/2005 | Damon | G11C 29/38 714/718 |
| 2010/0103712 | A1* | 4/2010 | Irby | G11C 15/00 365/49.17 |
| 2011/0310685 | A1* | 12/2011 | Song | G11C 5/00 365/201 |

* cited by examiner

*Primary Examiner* — Cynthia Britt
(74) *Attorney, Agent, or Firm* — Crowe & Dunlevy

(57) ABSTRACT

Disclosed herein is a test circuit for testing a device under test (DUT). The test circuit receives a test pattern output by the DUT. A content addressable memory (CAM) stores expected test data at a plurality of address locations, receives the test pattern, and outputs an address of the CAM containing expected test data matching the received test pattern. A memory also stores the expected test data at address locations corresponding to the address locations of the CAM. A control circuit causes the memory to output the expected test data stored therein at the address output by the CAM. Comparison circuitry receives the test pattern from the input, and compares that received test pattern to the expected test data output by the control circuit, and generates an error count as a function of a number of bit mismatches between the received test pattern and the expected test data.

26 Claims, 6 Drawing Sheets

GENERIC WIDTH INDEPENDENT PARALLEL CHECKER FOR A DEVICE UNDER TEST

TECHNICAL FIELD

This is related to the field of testers or checkers for devices under test, and, in particular, to a parallel tester or checker for devices under test that can operate in a parallel fashion without being limited to a word width, and without being limited to a specific test pattern.

BACKGROUND

In order to test that a data communication channel, such as a high-speed serial optical interface or a hard disk device interface, is functioning properly, a known binary data sequence is typically injected or shifted into the input of the data communication channel, and the output of the data communication channel is then compared to an expected output so as to detect errors. The number of bit errors per unit time is referred to as the bit error rate (BER).

Conventional hardware structures known as pseudo-random binary sequence generators are often used to generate testing sequences. The testing sequences generated by pseudo-random binary sequence (PBRS) generators are "pseudo-random" in the sense that the frequency of occurrence of "1" and "0" symbols is close to, but not exactly, 50%. Hence, such testing sequences appear random even though they are, in reality, deterministic. In other words, once a certain number of consecutive symbols in a testing sequence are known, it is possible to calculate subsequent symbols in the testing sequence, given that the algorithm used to generate the testing sequence is also known. This deterministic characteristic allows a pseudo-random binary sequence checker located at the receiving end of a data communications channel to verify the correctness of the transmitted sequence.

One type of checker for performing the above discussed testing is a serial checker. However, serial checkers consume a large amount of power at high data rates, which can be particularly undesirable for use in electronic devices that run on battery power. Therefore, parallel checkers have been developed. Due to the fact that such parallel checkers receive data bits in parallel as words, their power consumption for a given data rate is substantially less than that of a serial checker.

However, parallel checkers are not without their drawbacks. For example, parallel checkers have a fixed data width at their input, and thus operate only for data words of a given size. In addition, such parallel checkers are often limited to a fixed length of PBRS sequence. Furthermore, such parallel checkers require PBRS test sequences to operate, and in some cases, other types of test sequences may be more preferable.

Therefore, further development in the area of parallel data checkers is needed.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Disclosed herein is an electronic device for testing a device under test. The electronic device includes a test circuit. The test circuit has an input receiving a test pattern output by the device under test. A content addressable memory (CAM) stores expected test data at a plurality of address locations, is coupled to receive the test pattern from the input, and is configured to output an address of the CAM containing expected test data matching the received test pattern. A memory also stores the expected test data at a plurality of address locations corresponding to the plurality of address locations of the CAM. A control circuit is configured to cause the memory to output the expected test data stored therein at the address output by the CAM. Comparison circuitry is coupled to receive the test pattern from the input and is configured to compare that received test pattern to the expected test data output by the control circuit, and generate an error count as a function of a number of bit mismatches between the received test pattern and the expected test data output by the control circuit.

Also disclosed herein is a method aspect. The method includes searching a content addressable memory (CAM) storing expected test data at a plurality of address locations, and outputting from the CAM an address thereof containing expected test data matching a received test pattern. The method continued with causing a memory also storing the expected test data at a plurality of address locations corresponding to the plurality of address locations of the CAM to output the expected test data stored therein at the address output from the CAM, and then comparing the received test pattern to the expected test data output. An error count is generated as a function of a number of bit mismatches between the received test pattern and the expected test data output by the control circuit.

DETAILED DESCRIPTION

The present description is made with reference to the accompanying drawings, in which example embodiments are shown. However, many different embodiments may be used, and thus the description should not be construed as limited to the embodiments set forth herein. Rather, these embodiments are provided so that this disclosure will be thorough and complete.

Figure 1:
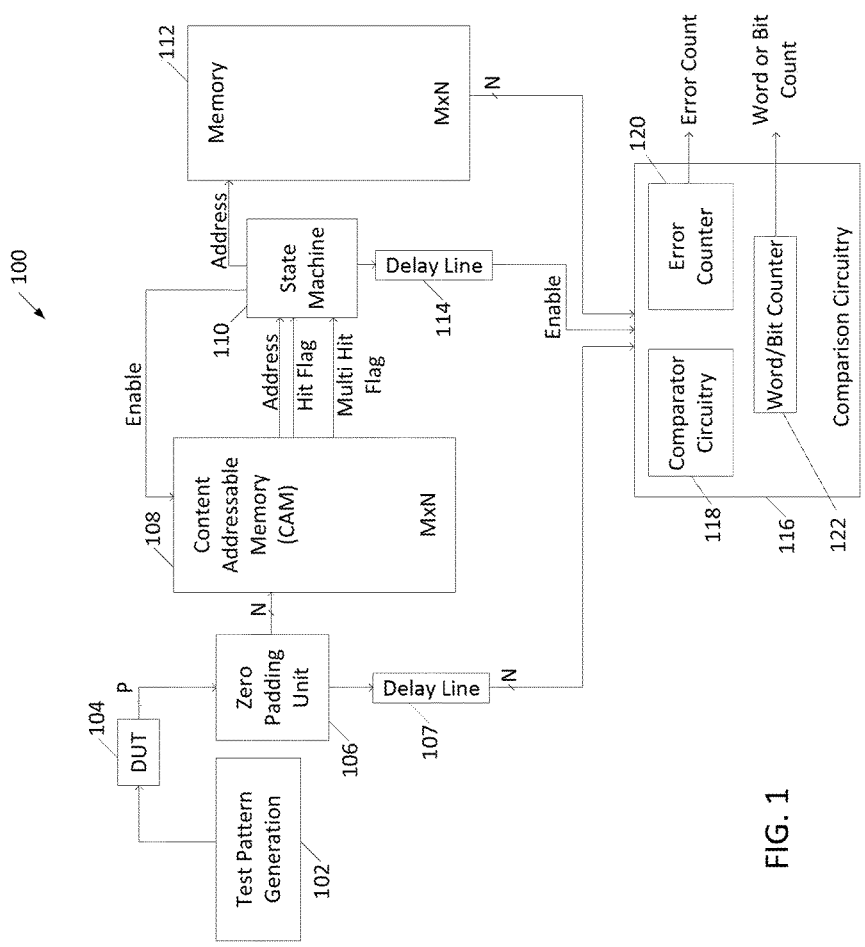
FIG. 1 is a schematic block diagram of a parallel data checker in accordance with this disclosure.

With initial reference to FIG. 1, a parallel data checker 100 is now described. The parallel data checker 100 receives a test pattern from a device under test (DUT) 104, which itself received the test pattern from a test pattern generator 102. Where a bit of the test pattern received from the DUT 104 does not match a bit of the expected test pattern, an error occurs. These test patterns can be any kind of test pattern, such as PBRS, CJTPAT (compliant jitter tolerance pattern), CRPAT (complaint random test pattern), etc, and such test pattern may be of any length.

The test pattern from the DUT 104 is received in parallel fashion as words of P bits, at a zero padding unit 106, which serves to append a sufficient number of zeroes to A the beginning of each word so as that each word becomes a N bit word, where N=P+A. By designing the parallel data checker 100 to be of a sufficient number of N bits, it can therefore function for data received as words of any number of P bits, where P is no greater than N. The zero padding unit 106 is shown in greater detail in FIG. 3, and will be described in greater detail below.

Each N-bit word of the received test pattern, as output by the zero padding unit 106, is then fed in parallel to a content addressable memory (CAM) 108. A CAM, as its namesake suggests, performs content matching instead of address matching as performed by other memories. That is, other memories receive an address as input, and then output the data at that address; whereas, a CAM receives data as input, and then outputs the address at which that data is stored in the CAM.

This content matching search mechanism enables a CAM to search data in a single clock cycle, making it faster than other hardware performing this functionality. A CAM of size M×N (where M is the number of address locations and N is width of each location) has M greater than or equal to the test pattern length and N greater than or equal to the width of the data on the input of the checker. The CAM 108 shown in FIG. 1 has N is equal to the width of data words of the received test pattern, which is also N, and M is equal to the length of the test pattern.

The CAM 108 contains all possible combination of reference test patterns that can be received at the input of the parallel data checker 100. For example, a 40 bit data width can be received, and may be a PRBS7 reference pattern, and the CAM 108 may store all 127 combinations of the PRBS7 reference pattern. Thus, the CAM 108 may store PRBS7 data bits D1-D40 at a $1^{st}$ location, data bits D2-D41 at a $2^{nd}$ location, and so on and so forth, ending with data bits D127-D39 at a $127^{th}$ location.

The CAM 108 compares the incoming test pattern against an expected test pattern stored therein it and returns the address of the matching location along with an asserted hit signal. In case of test patterns where there are a large number of consecutive 1's and 0's, contents of various locations in the CAM 108 will match. In the case where multiple matches of a data word are found, in addition to asserting the hit signal, the CAM 108 will assert a multi-hit signal.

The address, hit flag, and multi-hit flag are passed to a state machine 110. The state machine 110 senses the assertion of the hit flag and passes the address location to a memory 112, as will be explained below. The memory 112 is a mirror of the CAM 108, in that the memory 112 and CAM 108 have a same size M×N, and identical contents stored at identical addresses, although these sizes.

Once the hit flag is asserted (and the multi-hit flag is not asserted at that time), "synchronization" has been completed at address X, such that successive words of the received test pattern should match successive words stored in the CAM 108 and memory 112 at addresses X+P, X+2P, X+3P, and so on.

If the width of the data at the input of the checker 100 is less, multiple consecutive assertions of the hit flag are considered for completion of synchronization. Some DUTs 104 may send raw data prior to application of the test pattern when powered up. This data is not data to be considered. If the width of the data at the input of the checker 100 is small, data to be search at locations of the CAM 108 are also small. Thus, the possibility of the raw data matching content of the CAM 108 is greater in this case.

Therefore, differentiating between a hit flag assertion due to true test data and due to raw data is important. Therefore, the state machine 110 may be configured to consider multiple consecutive assertions of the hit flag. Suppose first, the hit flag indicates a match at address X in the cam 108. Thereafter, a second consecutive hit flag should indicate a match at address X+P. If this does not happen, then the hit flag will be ignored by state machine 110. Therefore, multiple consecutive hit flag assertions may be considered to ensure proper synchronization.

Once synchronization is established, the state machine 110 de-asserts an enable flag indicating the completion of synchronization, disabling the CAM 108 to save the further power consumption by it. Where the hit flag is asserted (and the multi-hit flag is not asserted at that time), the state machine 110 passes the initial address location to the memory 112, as stated. The memory 112 in turn outputs the contents of matched address location. Where the hit flag is not asserted, or where the multi-hit flag is asserted, the state machine 110 does not pass the address location to the memory 112.

As shown, the zero padding unit 106 is coupled to comparison circuit 116 such that the comparison circuit 116 receives the test pattern received from the DUT 104. The memory 112 outputs the contents of the matching address location received from the state machine 110, which contain the expected bits of the test pattern, to the comparison circuit 116 as well.

A delay line 107 is used to introduce latency to the output of the zero padding unit 106 so as to delay the incoming data by a suitable number of cycles such that the total latency from CAM 108, state machine 110 and memory 112 are equal, resulting in these data being aligned when they are passed to the comparison circuitry 116. The delay line 107 may be a chain of flip-flops or inverters, in some cases.

Figure 5:
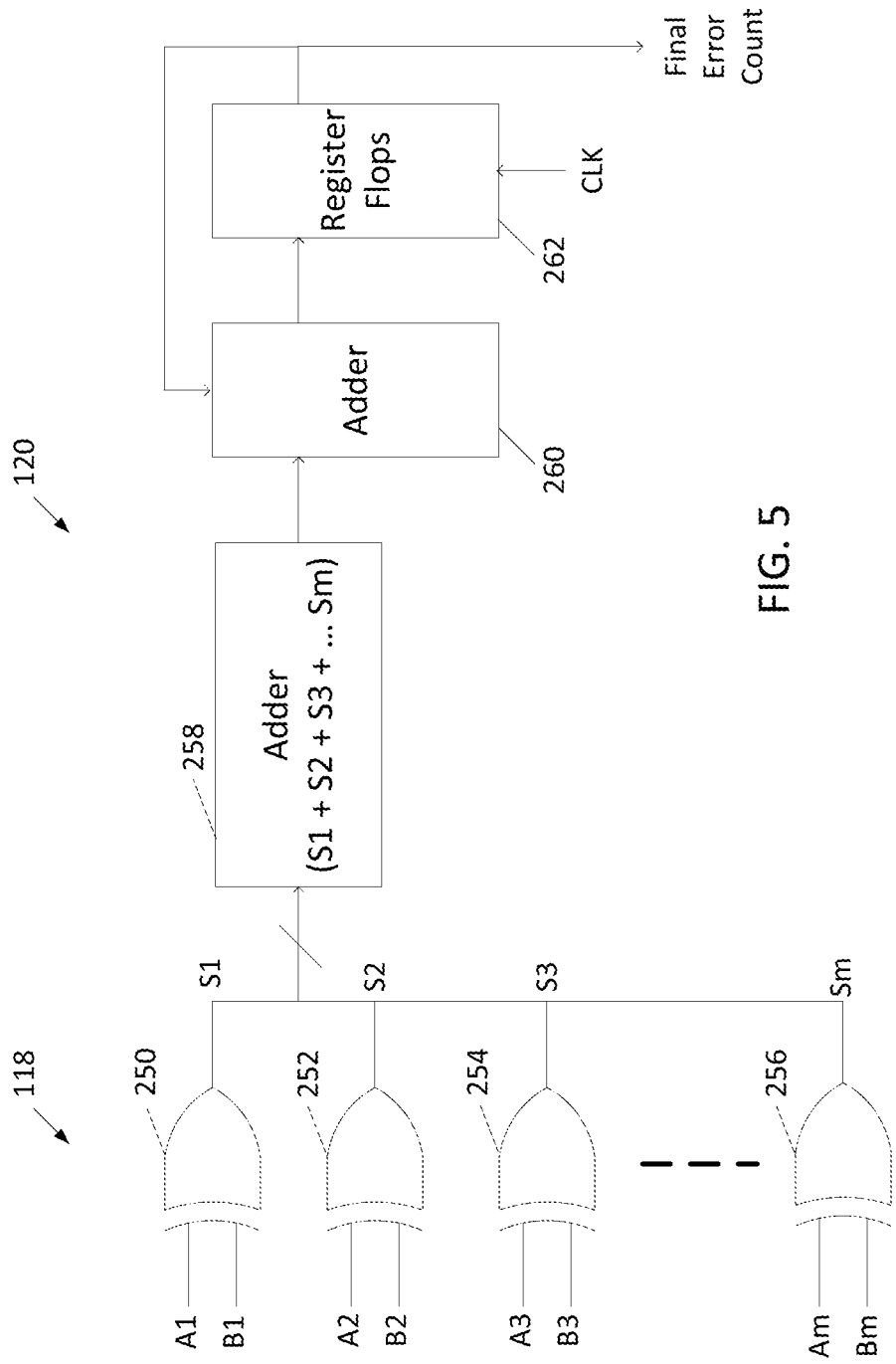
FIG. 5 is a schematic block diagram of the comparator circuitry and error counter of FIG. 1.

The comparison circuitry 116 includes comparator circuitry 118 which employs XOR logic to compare received words from the DUT 104 to received words from the memory 112. Where there is a bit mismatch, a bit error is detected. The comparator circuitry 118 is shown in FIG. 5, and includes XOR gates 250-256 comparing a received word from the DUT 104 (bits of which are shown as A1-Am) to a received word from the memory 112 (bits of which are shown as B1-Bm). Where there is a mismatch, the respective XOR gate 250-256 output a logic high signal or 1. Therefore, by counting the number of 1's produced by the XOR gates 250-256, the error count in a word can be determined by the error counter 120, as shown in FIG. 5, which counts the number of bit mismatches A more detailed explanation of operation of the error counter 120 is now given. As an example, suppose there is a three bit mismatch at comparator input 118 such that S3, S6, and S8 are asserted. The adder 258 will then provide an output of 3, which is fed to adder 260. Adder 260 receives input from adder 258 and another input from the final error count as output by the register flops 262. The final error count will be zero initially, which will then be added to the 3 output by the adder 258. Thus, final error count then becomes 3 at the output of the register flops 262, indicating that 3 erroneous bits have been detected thus far. Now, in second cycle, supposing there is no mismatch, the final error count will remain at 3. In a third cycle, supposing there is a two bit mismatch at S2 and S4, adder 258 will output a two, and adder 260 will add the previous error count 3, to the present error count 2, and the final error count will thus be 5 and be stored in the register flops 262.

Figure 2:
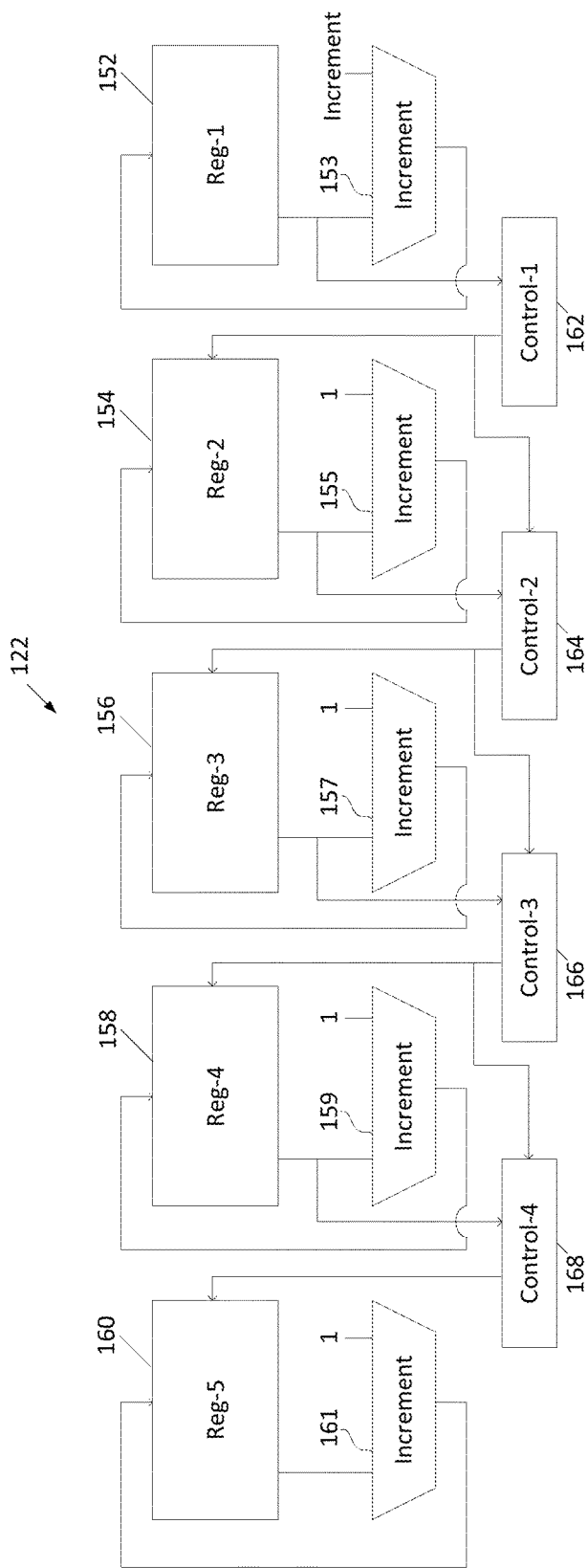
FIG. 2 is a schematic block diagram of the word counter of the parallel data checker of FIG. 1.

Word counter 122, as shown in FIG. 2, is used to count the total number of words of data. Word counter 122 is a multi-stage counter, and increments the word count with the passage of each word of data at very high frequency regardless of word size. In operation, the first stage counter increments as each word passes, and when the first stage counter overflows, it asserts a flag for the second stage counter, and the second stage counter increments. Similarly, when the second stage counter overflows, it asserts a load flag for a third stage, if any. Thus, the frequency of operation depends on the first stage counter.

As an example, initially, Reg-1, Reg-2, Reg-3, Reg-4 and Reg-5, reference numerals 152, 154, 156, 158, 160, are registers of width 10 (as an example) and are at a value of zero. When an increment or enable signal is received at the first stage, the increment block 161 increments Reg-1 by 1. The other stages remain in an idle state, i.e. a waiting state. In successive increment/enable signal assertions, Reg-1 keeps on incrementing and the other stages remain idle. When the count of Reg-1 overflows or reaches the max value (1111111111), Control-1 block 162 asserts a load signal for the next stage and the value calculated by increment block of stage 2, reference numeral 155, i.e. (0000000001) is loaded into Reg-2. This cascades through the stages until the final word count is reached.

As described above, once synchronization has been reached, the state machine 110 disables the CAM 108. Thereafter, the state machine 110 generates the addresses of the memory 112 from which to extract expected data to be compared with incoming data. This address is generated as: Next Address=(Present Address+Data Width) % Test Pattern Length. Thus, the next address is the remainder of a divide of a sum of the present address and the data width, and a length of the test pattern.

Figure 3:
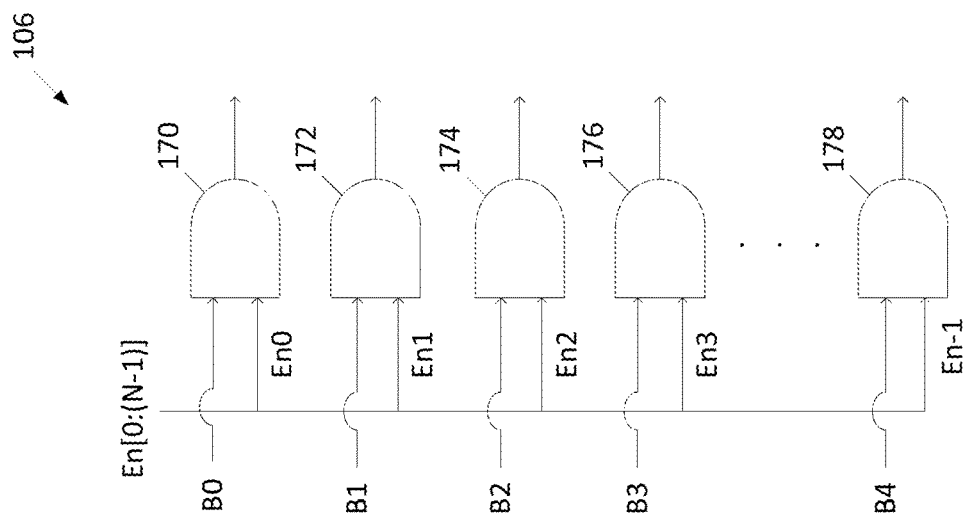
FIG. 3 is a schematic block diagram of the zero padding unit of FIG. 1.

With reference to FIG. 3, the zero padding unit 106 is now described in detail. The zero padding unit 106 contains a number of AND gates 170-178 no less than the greatest number word length it is desired for the checker 100 to be capable of operating on. There is a dedicated enable line En0-En-1 as a first input for each AND gate 170-178, and as a second input each AND gate 170-178 receives a bit of an incoming word of the test pattern. If an output M bit word is desired, then the enable lines En0-En-1 enable the first M AND gates 170-178, serving to pass through received bits, and to output zeroes where bits are not received.

The CAM 108 and memory 112 are filled as follows. For data of a width P at the input of the checker 100, N-P most significant bits of the CAM 108 and memory 112 are filled with 0's, and the test pattern remains in the LSB P bits of each location of the CAM 108 and memory 112. The use of the zero padding unit 106 is not necessary to achieve width independence, but instead serves to help avoid raw data on unused data lines.

It should be appreciated that the state machine 110 may be implemented as discrete components, such as logic gates or transistors. In addition, all, or portions of, the checker 100 may be implemented as programmed components in a field programmable gate array programmable logic converter, or other such device.

The checker 100 is independent of test pattern length, test pattern word width, and type of test pattern. This advantageously allows the checker 100 to be used in a large variety of applications.

Figure 4:
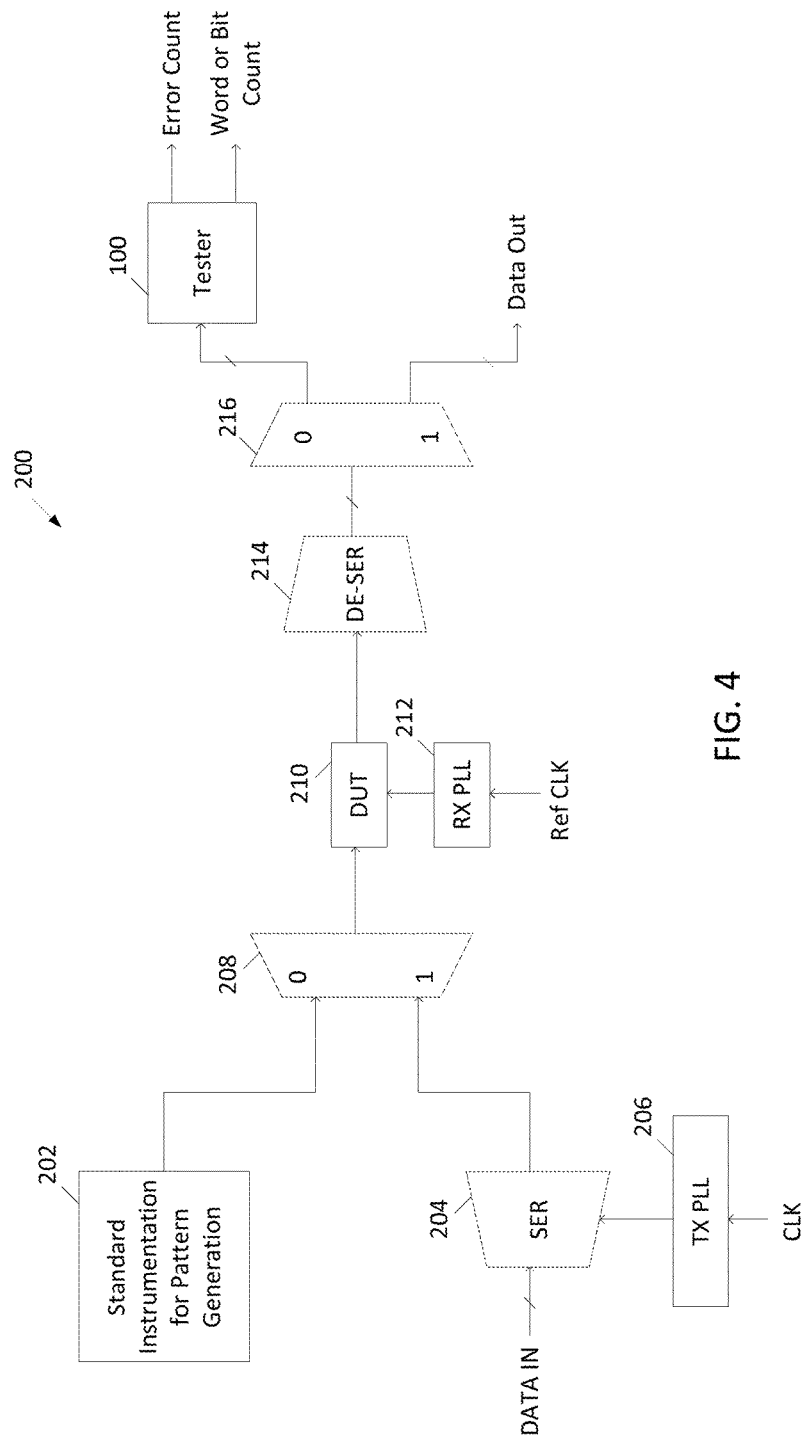
FIG. 4 is a schematic block diagram of the parallel data checker implemented into a built in self-test circuit in an ASIC chip.

In addition, as shown in FIG. 4, the checker 100 may be used as part of a built in self-test (BIST) for an application specific integrated circuit (ASIC). As shown, when a multiplexer (MUX) 208 selects to receive a test pattern in serial fashion from serial transmitter 204, operating at a frequency defined by a TX phase locked loop (PLL) 206, a DUT 210 receives that test pattern in a serial fashion under control of a RX PLL 212. The DUT 210 passes the test pattern to a de-serializer 214, that converts the test pattern into parallel format in cooperation with MUX 216, for passing to the tester 100 which then operates as described above.

Figure 6:
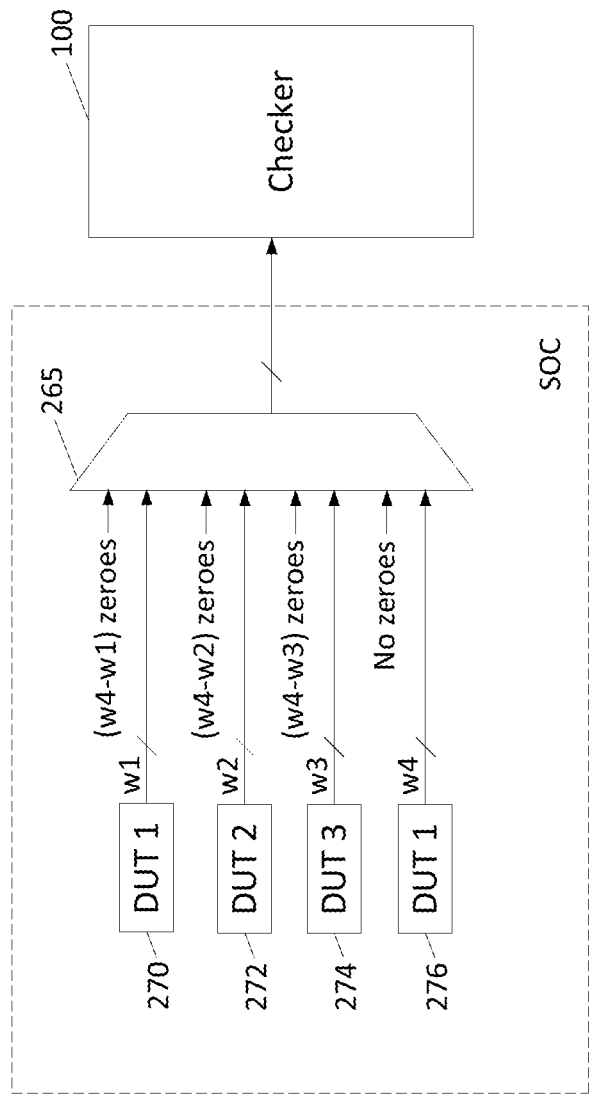
FIG. 6 is a block diagram off the parallel data checked functioning to test different devices of a system on a chip.

The checker 100 may be used within, or with, a system on a chip (SOC), as shown in FIG. 6, to determine error bits and bit error rates of devices 270-276 that utilize different test patterns, or use different word widths for their test pattern. As shown, the different devices 270-276 may be multiplexed to the SOC by multiplexer 265. This can advantageously help save space in this environment over using multiple such checker systems.

The checker 100 may be used to calculate the BER of any serial receiver, or any other type of receiver, by de-serializing the received data for checking. This way, any data width or test pattern can be accommodated.

When dimensioning the CAM 108 and memory 112, register transfer level design (RTL) can be used so as to minimize the area and power consumed for the desired application constraints.

Many modifications and other embodiments will come to the mind of one skilled in the art having the benefit of the teachings presented in the foregoing descriptions and the associated drawings. Therefore, it is understood that various modifications and embodiments are intended to be included within the scope of the appended claims.

The invention claimed is:

1. An electronic device for testing a device under test, the electronic device comprising:
    a test circuit comprising:
        an input receiving a test pattern output by the device under test;
        a content addressable memory (CAM) storing expected test data at a plurality of address locations, the CAM being coupled to receive the test pattern from the input and configured to output an address of the CAM containing expected test data matching the received test pattern;
        a separate memory also storing the expected test data at a plurality of address locations corresponding to the plurality of address locations of the CAM, the separate memory being separate and distinct from the CAM;
        a control circuit configured to cause the separate memory to output the expected test data stored therein at the address output by the CAM;
        comparison circuitry coupled to receive the test pattern from the input and receive the expected test data from the control circuit, the comparison circuitry configured to:
            compare that received test pattern to the expected test data output by the control circuit;
            generate an error count as a function of a number of bit mismatches between the received test pattern and the expected test data output by the control circuit, wherein the error count is indicative of whether the device under test passed the test.

2. The electronic device of claim 1, wherein the control circuit is configured to disable the CAM as a function of receiving the address of the CAM containing expected test data matching the received test pattern, and to thereafter increment an address of the separate memory from which the expected test data is output.

3. The electronic device of claim 1, further comprising counting circuitry cooperating with the comparison circuitry and configured to output a number of words of the test pattern received.

4. The electronic device of claim 1, wherein the CAM is further configured to assert a hit flag as a function of outputting the address of the CAM containing the expected test data matching the received test pattern; and wherein the control circuit is configured to cause the separate memory to output the expected test data stored therein at the address output by the CAM when the hit flag is asserted.

5. The electronic device of claim 4, wherein the CAM is further configured to assert a multi-address flag as a function of multiple addresses of the CAM containing expected test data matching the received test pattern.

6. The electronic device of claim 5, wherein the control circuit does not cause the separate memory to output the expected test data stored therein at the address output by the CAM where the multi-address flag is asserted.

7. The electronic device of claim 6, wherein the control circuit is configured to enable the comparison circuitry to perform the comparison synchronously with receipt of the expected test data output by the control circuit and the received test data.

8. The electronic device of claim 4, wherein the control circuit comprises a state machine.

9. The electronic device of claim 1, further comprising a delay circuit coupled between the input and the comparison circuitry and configured to delay the received test pattern output by the device by an amount sufficient such that the comparison circuitry receives the expected test data output by the control circuit and the received test pattern in a synchronized fashion.

10. The electronic device of claim 9, wherein the delay circuit comprises a chain of flip flops.

11. The electronic device of claim 1, wherein the CAM has a size of M×N, where M is a number of address locations of the CAM and is at least equal to a length of the output test pattern, and where N is a width of each address location and at least equal to a width of the test pattern received at the input.

12. The electronic device of claim 11, further comprising a zero padding circuit coupled between the device and the input, and configured to add an appropriate number of zeroes to the test pattern so as to divide the test pattern to words having a bit length of N.

13. The electronic device of claim 1, wherein the test circuit is formed from programmed components of a field programmable gate array.

14. The electronic device of claim 1, wherein the test pattern output by the device is output serially; further comprising a de-serializing circuit configured to convert the test pattern to parallel format for generation on the input of the test circuit as separate words of N bits; and wherein the CAM receives the test pattern in parallel fashion as the separate words of N bits.

15. The electronic device of claim 1, wherein the comparison circuitry is further configured to generate a bit error rate as a function of the error count.

16. A method of testing a device under test, the method comprising:
    searching a content addressable memory (CAM) storing expected test data at a plurality of address locations;
    outputting from the CAM an address thereof containing expected test data matching a received test pattern;
    causing a separate memory also storing the expected test data at a plurality of address locations corresponding to the plurality of address locations of the CAM to output the expected test data stored therein at the address output from the CAM to comparison circuitry, the separate memory being separate and distinct from the CAM;
    comparing the received test pattern to the expected test data output, using the comparison circuitry;
    generating an error count as a function of a number of bit mismatches between the received test pattern and the expected test data, wherein the error count is indicative of whether the device under test passed the test.

17. The method of claim 16, further comprising disabling the CAM in response to outputting the address of the CAM containing expected test data matching the received test pattern, and thereafter incrementing an address of the separate memory from which the expected test data is output.

18. The method of claim 16, further comprising counting and outputting a number of bits of the test pattern received.

19. The method of claim 16, further comprising asserting a hit flag in response to outputting the address of the CAM containing the expected test data matching the received test pattern; and wherein the separate memory is caused to output the expected test data stored therein at the address output by the CAM when the hit flag is asserted.

20. The method of claim 16, further comprising asserting a multi-address flag based upon multiple addresses of the CAM containing expected test data matching the received test pattern.

21. The method of claim 20, further comprising not causing the separate memory to output the expected test data stored therein at the address output by the CAM where the multi-address flag is asserted.

22. An electronic device for testing a device under test, the electronic device comprising:
    a test circuit comprising:
        an input receiving a test pattern output by the device under test;
        a content addressable memory (CAM) coupled to receive the test pattern from the input and configured to output an address of the CAM containing expected test data matching the received test pattern;
        a separate memory also storing the expected test data at a plurality of address locations corresponding to the plurality of address locations of the CAM;
        a control circuit configured to cause the separate memory to output the expected test data stored therein at the address output by the CAM;
        comparison circuitry coupled to receive the test pattern from the input and receive the expected test data from the control circuit, the comparison circuitry configured to compare that received test pattern to the expected test data output by the control circuit and indicate whether the device under test passed the test as a function of the comparison.

23. The electronic device of claim 22, wherein the control circuit is configured to disable the CAM as a function of receiving the address of the CAM containing expected test data matching the received test pattern.

24. The electronic device of claim 22, further comprising counting circuitry cooperating with the comparison circuitry and configured to output a number of words of the test pattern received.

25. The electronic device of claim 22, wherein the CAM is further configured to assert a hit flag as a function of outputting the address of the CAM containing the expected test data matching the received test pattern.

26. The electronic device of claim 22, wherein the CAM is configured to assert a multi-address flag as a function of multiple addresses of the CAM containing expected test data matching the received test pattern.

* * * * *